United States Patent [19]

Schiek et al.

[11] Patent Number: 5,142,220
[45] Date of Patent: Aug. 25, 1992

[54] MULTISTAGE SINGLE-SIDEBAND SHIFTER

[75] Inventors: Burkhard Schiek, Bochum; Hermann-Josef Eul, Essen, both of Fed. Rep. of Germany

[73] Assignee: Laboratorium Prof. Dr. Rudolf Berthold, Wildbad, Fed. Rep. of Germany

[21] Appl. No.: 369,809

[22] Filed: Jun. 22, 1989

[30] Foreign Application Priority Data

Jun. 23, 1988 [DE] Fed. Rep. of Germany ....... 3821040

[51] Int. Cl.⁵ .......................................... G01R 23/14
[52] U.S. Cl. ............................... 324/79 R; 324/83 R
[58] Field of Search .............. 324/79 R, 83 R, 77 B; 364/485; 333/139; 307/511, 262; 328/155

[56] References Cited

U.S. PATENT DOCUMENTS

| 3,290,624 | 12/1966 | Hines | 307/511 |
| 4,626,796 | 12/1986 | Elder | 328/155 |
| 4,709,170 | 11/1987 | Li | 307/511 |

Primary Examiner—Hezron E. Williams
Assistant Examiner—Louis M. Arana
Attorney, Agent, or Firm—Spensley Horn Jubas & Lubitz

[57] ABSTRACT

A multistage single-sideband shifter composed of N switchable phase shifters connected in cascade, where N is a positive integer greater than 1, each phase shifter being constructed to produce a switchable phase shift and a control unit connected to the phase shifters for switching the phase shifters chronologically successively in a selected sequence into all possible $2^N$ combinations, for periodically repeating the selected sequence, and for chronologically reversing the selected sequence.

12 Claims, 3 Drawing Sheets

MULTISTAGE SINGLE-SIDEBAND SHIFTER

BACKGROUND OF THE INVENTION

The invention relates to a method for making a multistage single-sideband shifter. This is done by cascading switchable phase shifters, because the suppression of the undesired sideband increases with an increasing number of cascaded phase switches. If the number of phase switches is N, then the effective number of stages of the single-sideband shifter, if it differs from the number of phase switches, is $N_{eff}$.

Single-sideband shifters of this kind are used for instance to make homodyne network analyzers. In that case, as shown in FIG. 1, an oscillator signal 1 of frequency $f_1$ is split via a signal divider 2 into a measurement signal branch 3 and a reference signal branch 4. In measurement signal branch 3 the N switchable phase shifters, here for instance three phase shifters 5, 6 and 7, and the measurement target, or device being tested, 8 are connected in series to produce an output signal at frequency $f_2$. The signals of reference branch 4 and measurement branch 3 are superimposed in a mixer 9, producing an intermediate frequency signal of frequency $f_O = |f_2 - f_1|$, from which possible secondary waves, a term which includes for instance harmonic waves or subharmonics, are eliminated in a bandpass filter 10.

Each device 5, 6 and 7 can be a conventional phase shifter having a bypass switch connected between its input and output so that when the switch is closed, a conductive path is established between the input and output and no or a small phase shift takes place. Each bypass switch can be connected to a control circuit which controls its switching state.

The device under test, 8, may be any active or passive two-port device, e.g., an electrical filter, an amplifier, a switching network, an antenna arrangement, etc.

If the single-sideband shifter is operated in accordance with the invention, which means that the frequency of the frequency-shifted useful signal is $f_2 = f_1 \pm f_O$, and that the associated image signal representing interference is quite low, then the bandpass-filtered intermediate frequency signal, the magnitude and phase of which can be evaluated by conventional methods, is proportional to the signal of measurement branch 3 and hence is also a standard for the complex transfer function H of measurement target 8. To this end, as is well known, the mixer must be operated quasi-linearly, which means that mixer 9 must function like an ideal multiplier and/or the signal in reference branch 4 must have a large amplitude compared with the signal in measurement branch 3.

If the phase switches are initially switched very slowly, so that quasi-stationary operation prevails ($f_2 = f_1$), then the mixer, at its low-frequency output, furnishes a direct voltage that is a standard for a real portion of the complex transfer function $H_O = K_O H$ of the entire signal branch. $K_O$ contains not only the basic damping and the basic phase but also the complex conversion factor of the mixer.

Also appearing at the mixer output is a direct voltage, the so-called mixer offset voltage, which is assumed to be eliminated or rendered ineffective in a suitable manner. The way this happens will be described in detail hereinafter. With these preconditions, the following equation is applicable for the output voltage of the mixer:

$$U_{ml} = U_1 = \mathrm{Re} H_O = \tfrac{1}{2}(H_O + H_O^*),$$

where $H_O^*$ designates the complex variable conjugated for $H_O$.

First, as an example, an apparatus including two phase switches will be considered, in which the phase switches are decoupled, so that their switchover can be completely described by a complex factor k. The entire transfer function $H_O$ is varied from $H_O$ to $H_O k_1$ by switching on the phase switch I; similarly, for switching on the phase switch II, $H_O \rightarrow H_O k_2$. If both phase switches are turned on simultaneously, the result is $H_O \rightarrow H_O k_1 k_2$, so that the associated mixer output voltages become as follows:

$$U_1 = \tfrac{1}{2}(H_0 + H_0^*) \tag{1}$$

$$U_2 = \tfrac{1}{2}(H_0 k_1 + H_0^* k_1^*) \tag{2}$$

$$U_3 = \tfrac{1}{2}(H_0 k_2 + H_0^* k_2^*) \tag{3}$$

$$U_4 = \tfrac{1}{2}(H_0 k_1 k_2 + H_0^* k_1^* k_2^*) \tag{4}$$

These voltages are linearly superimposed in a suitable manner, so that with the definition:

$$p_1 = 1, \; p_2 = p_1, \; p_3 = p_2 \; \text{and} \; p_4 = p_1 p_2$$

for the sum voltage $U_1$, the result is $$\begin{aligned}
U_1 &= \sum_{i=1}^{4} p_i U_i = U_1 + p_1 U_2 + p_2 U_3 + p_1 p_2 U_4 \\
&= \tfrac{1}{2} H_0(1 + p_1 k_1 + p_2 k_2 + p_1 p_2 k_1 k_2) + \\
& \quad \tfrac{1}{2} H_0^*(1 + p_1 k_1^* + p_2 k_2^* + p_1 p_2 k_1^* k_2^*) \\
&= \tfrac{1}{2} H_0(1 + p_1 k_1)(1 + p_2 k) + \\
& \quad \tfrac{1}{2} H_0^*(1 + p_1 k_1^*)(1 + p_2 k_2^*)
\end{aligned} \tag{5}$$

which if the weighting factors $p_1$ and $p_2$ are suitably selected, namely in accordance with equation 6, $$p_1 = -\frac{1}{k_1^*}, \; p_2 = -\frac{1}{k_2^*}, \tag{6}$$

is now proportional only to the desired transfer function H, but no longer to H*. This is because, on the condition of equation 6, it is true that:

$$U_1 = \tfrac{1}{2} K_0 H \left(1 - \frac{k_1}{k_1^*}\right)\left(1 - \frac{k_2}{k_2^*}\right), \tag{7}$$

in which the proportionality constant $$\tfrac{1}{2} K_0 H \left(1 - \frac{k_1}{k_1^*}\right)\left(1 - \frac{k_2}{k_2^*}\right)$$

is determined by a calibration measurement without a measurement target.

Generally, that is, with N phase switches, $2^N$ different switching states are possible, so that the voltages $U_i$, where $\ldots i = 1 \ldots 2^N$, are measured, which are summed up to make the sum voltage $U_1$ in accordance with the following:

$$U_1 = \sum_{i=1}^{2^N} p_i U_i \qquad (8)$$

$$= \tfrac{1}{4} H_0 \prod_{i=1}^{2^N} (1 + p_i k_i) + \tfrac{1}{4} H_0^* \prod_{i=1}^{2^N} (1 + p_i k_i^*) \qquad (9)$$

which on the following conditions $$p_i = -\frac{1}{k_i^*}, \; i = 1 \ldots 2^N \qquad (10)$$

is simplified to $$U_1 = \tfrac{1}{4} H_o \prod_{i=1}^{2^N} (1 + p_i k_i) \qquad (11)$$

However, if the weighting factors are not selected precisely in accordance with equation 10, then the sum voltage $U_1$ includes interference $H_O^*$ - although less so, the more factors the products in equation 9 have, because the interference term then diminishes increasingly exponentially, since even with deviations from the condition still it true )<<1. Since even in the absence of decoupling the phase switch has the effect of a deviation from the exact weighting factors, with an increasing number of stages it is increasingly possible to omit the decoupling.

The evaluation of the mixer output voltages according to equation 8 can be performed in that the $U_i$ is measured sequentially and summed up in a calculatedly weighted manner. For high-speed applications, however, this kind of procedure is too time-consuming; this is primarily due both to the transient events in the filter and to the finite conversion rate of the digital/analog converters.

SUMMARY OF THE INVENTION

It is an object of the present invention to form the weighted sum quickly and accurately in analog fashion in a suitable manner.

The above and other objects are achieved, according to the present invention, by a multistage single-sideband shifter comprising N switchable phase shifters connected in cascade, where N is a positive integer greater than 1, each phase shifter including switch means connected for switching the phase shift produced by each phase shifter, and control means connected to the switch means for switching the switch means chronologically successively in a selected sequence into all possible $2^N$ combinations, for periodically repeating the selected sequence, and for chronologically reversing the selected sequence.

To this end, the phase switches are set such that the magnitude of their transfer functions is as identical as possible in both positions; that is, $|k_i| \delta 1$, where $i = 1 \ldots 2^N$. Also, suitable phase switching values are selected, such as $$k_1 = e^{j180°}, k_2 = e^{\pm j90°}, \qquad (12)$$
$$k_3 = e^{\pm j45°}, \ldots k_N = e^{\pm j360/2^N},$$

in which arbitrary combinations of the algebraic sign (+ or −) of the exponents can be selected; the following examples use the positive values.

Arc(k) = 180° is a special case, because since $$k_{180}^* = k_{180}$$

the associated weighting factor cannot be selected in accordance with equation 10. In that case, the weighting factor $$p_{180} = +\frac{1}{k_{180}^*}, \qquad (13)$$

is possible, but then this phase switch no longer contributes to suppressing the interference term, so that for the number of stages $N_{eff}$ of the single-sideband shifter with N phase switches, $$N_{eff} = N - 1 \qquad (14)$$

is the result.

DESCRIPTION OF THE PREFERRED EMBODIMENTS

Figure 1:
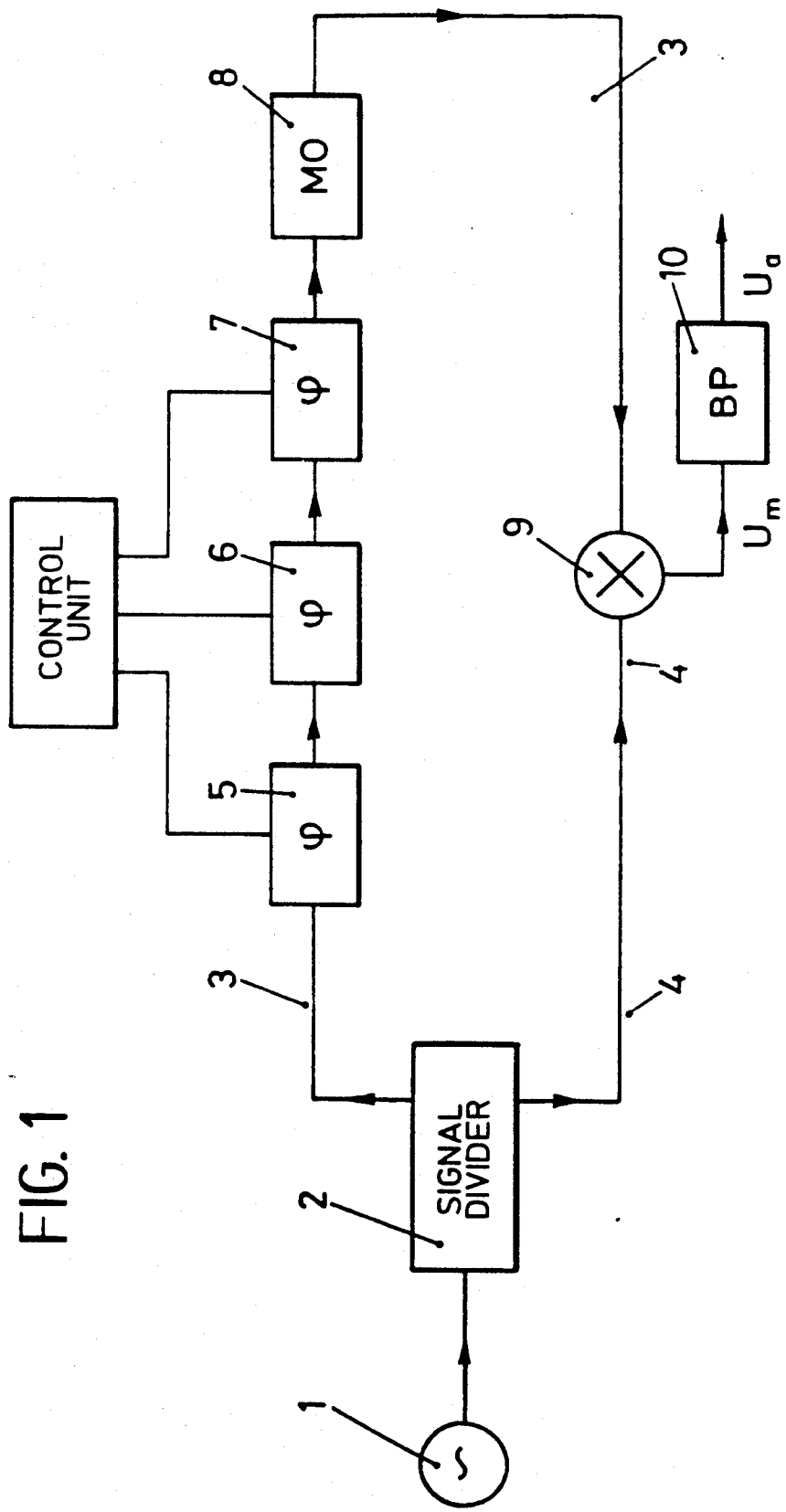
FIG. 1 is a circuit diagram of a network analyzer which has already been described and which can be constructed and operated in accordance with the present invention.

According to one preferred embodiment of the invention, the circuit shown in FIG. 1 can be constructed so that, for example, each device 5, 6 and 7 can each be switched between an inactive state, in which the device produces a phase shift of 0°, and an active state, in which device 5 produces a phase shift of 45°, device 6 produces a phase shift of 90° and device 7 produces a phase shift of 180°. This circuit, where N=3, functions effectively only like a two-stage apparatus, where $N_{eff}=2$. Switching may be controlled by appropriate operation of an otherwise conventional switching control unit connected to control the switch of each phase shifter 5, 6 and 7.

Nevertheless, the 180° switch performs important functions, in that it contributes to eliminating the mixer offset voltage and increases the efficiency of the single-sideband shifter. In principle, this phase switch could also be replaced with an amplitude modulator, which assumes the states "on" and "off" in the same manner as the phase switch assumes the states 0° and 180°, so that the number of stages of the single-sideband shifter would once again be identical to the number of phase shifters.

It should be noted at this point that with these phase switching values, the known stairstep function (described in Jaffe, J. S., Mackey, R. C., Microwave Frequency Translator, IEEE MTT 13, 1965, pp. 371-378) could also be simulated. This does not happen, however, because in that case, regardless of the number of stages N, the result obtained would always be only a single-sideband shifter with $N_{eff}=1$. Moreover, this apparatus does not exhibit the increasing insensitivity, with an increasing number N of stages, to deviations from the exact switching values.

To understand how equation 8 is satisfied by analog means, this will now be described in terms of a two-stage single-sideband shifter having three phase switches, that is, where N=3 and $N_{eff}=2$. The weighting factors should be selected in accordance with equation 10, as follows:

$$-\to p_1 = 1 = e^{j0^\circ} \to U_1 \quad (15)$$

$$1 \to p_2 = p_1 = \frac{1}{k_1^*} = e^{-j180^\circ} \to U_2$$

$$II \to p_3 = p_2 = -\frac{1}{k_2^*} = e^{-j90^\circ} \to U_3$$

$$III \to p_4 = p_3 = -\frac{1}{k_3^*} = e^{-j135^\circ} \to U_4$$

$$I, II \to p_5 = p_1 p_2 = -\frac{1}{k_1^* k_2^*} = e^{-j270^\circ} \to U_5$$

$$I, III \to p_6 = p_1 p_3 = -\frac{1}{k_1^* k_3^*} = e^{-j315^\circ} \to U_6$$

$$II, III \to p_7 = p_2 p_3 = -\frac{1}{k_2^* k_3^*} = e^{-j225^\circ} \to U_7$$

$$I, II, III \to p_8 = p_1 p_2 p_3 = \frac{1}{k_1^* k_2^* k_3^*} = e^{-j45^\circ} \to U_8$$

The eight switching states are switched on periodically in a suitable sequence at the frequency $f_O = 1/T_O$. The duration of each active phase is designated $\Delta\tau$, and the chronological interval between two successive active phases is $\tau$, so that:

$$\Delta\tau \leq \tau, \quad \tau = \frac{T_o}{2^N} \quad (16)$$

Figure 2:
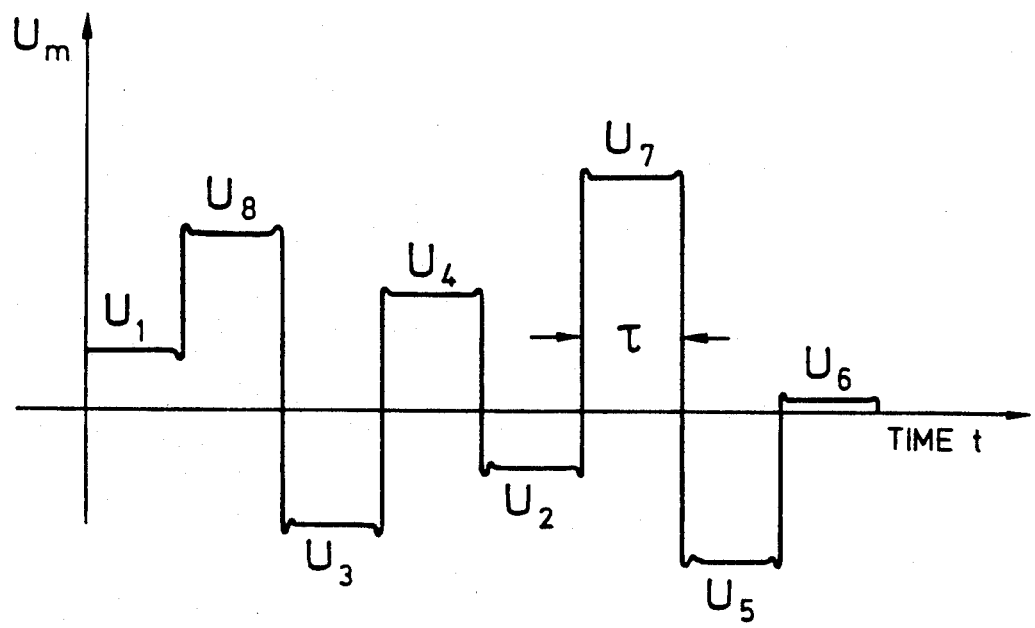
FIGS. 2 and 3a-b are waveform diagrams illustrating the operation of a network analyzer and phase shifting system according to the invention.

FIG. 2 shows a voltage pattern such as can occur at the mixer output of the above apparatus; the voltages of the plateaus agree with the voltages $U_1, \ldots, U_8$, although a suitable sequence must be adhered to, which should be selected here as follows:

$$U_m(t) = U_1 \xrightarrow{\tau} U_8 \xrightarrow{\tau} U_3 \xrightarrow{\tau} U_4 \xrightarrow{\tau} U_2 \xrightarrow{\tau} U_7 \xrightarrow{\tau} U_5 \xrightarrow{\tau} U_6 \quad (17)$$

From equation 17 taken together with equation 15, it becomes clear that the weighting factor $\tau_i$ valid at a particular time varies upon each increment by the factor $e^{-j45^\circ}$ or in general, $\ldots e^{-j360^\circ/2^N}$. This means that the switching signals are arranged chronologically in such a way that for their starting times the following equation applies:

$$t_i = -\frac{\arc(p_i)}{360^\circ} T_0 - \frac{T_0}{2^N} - t_0, \text{ where } i = 1, 2, \ldots 2^N \quad (18)$$

where $t_0$ is an arbitrary starting time. As with this selection of the algebraic signs of the exponents in equation 12, it is also true for others that among the $p_i$, every multiple of $360^\circ/2^N$ occurs precisely once.

From the mixer output signal, by means of an adequately narrow, low-frequency bandpass filter of mean frequency $f_O = 1/T_O$, the signal $U_a$ with the basic frequency $f = f_O$, which is proportional in magnitude and phase to the sum voltage $U_1$ and hence to the complex transfer function, is filtered out.

By means of the chronological arrangement of the switching states shown, and by the bandpass filtering, it is thus attained that the signal $U_a$ is weighted in the same manner as the sum voltage $U_1$ of equation 8.

Figure 3A:
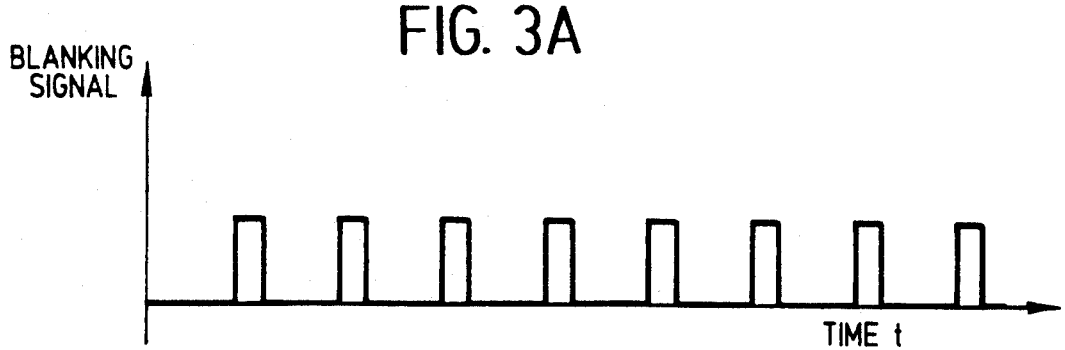
Figure 3B:
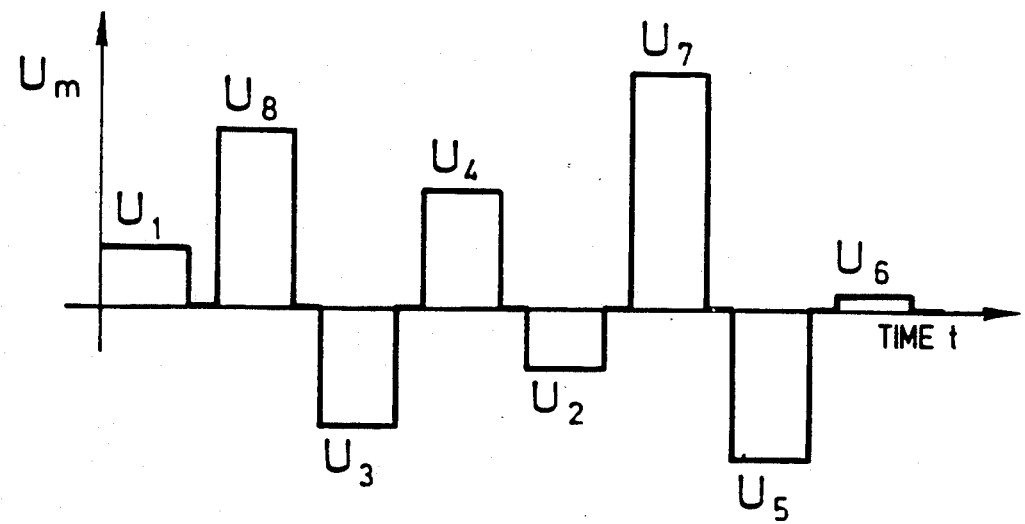

If a chronological arrangement is selected, in which not all the instants in one period are occupied by a useful signal, then these locations must be rendered ineffective by a blanking mechanism. If the occupation periods are equidistant, then the blanking can be performed on the low-frequency side of the system; otherwise, it must take place on the high-frequency side. But even in the case of an uninterruptedly occupied time axis, blanking is recommended, such that it blanks out transient events in the switchover between the various states. In these cases, $\Delta\tau\tau$ is less than $\tau$; see FIG. 3. While a mixer offset voltage itself, if only because of the evaluation of the signal with the frequency $f = f_O$, does not interfere, no interference occurs either because of the low-frequency periodic blanking signal, because this blanking signal generates interference signals only at harmonic waves of $f_O$, which are eliminated by the bandpass filtering.

The sine-wave output signal $U_a$ of the bandpass filter is an increasingly good standard, with an increasing number of stages, for the complex transfer function of the high-frequency branch 3, in terms of magnitude and phase. Accordingly, this arrangement of the switched phase shifters represents a virtually ideal single-sideband shifter, in which the upper sideband $f = f_1 + f_O$ is of high amplitude, and the lower sideband $f = f_1 - f_O$ is of very low amplitude. To suppress the upper sideband, the sequence of the phase switching states must be chronologically inverted.

In a modification of the above-described circuit, individual ones of the phase shifters, or all of them, can be accommodated in reference branch 4, in which case care should be taken that the weighting factors be selected in accordance with $$p_i = -\frac{1}{k_i}, \quad i = 1, \ldots 2^N \quad (19)$$

Also, in a modification of the above-described method, a different favorable selection of the phase switching values can be undertaken, that is $$k_1 = e^{j180^\circ}, \quad k_2 = k_3 = e^{\pm j90^\circ} \quad (20)$$

Analogously to the above, when the positive algebraic sign is used the weighting factors are determined as follows:

$$-\to p_1 = 1 = e^{j0^\circ} \to U_1 \quad (21)$$

$$1 \to p_2 = p_1 = \frac{1}{k_1^*} = e^{-j180^\circ} \to U_2$$

$$II \to p_3 = p_2 = \frac{-1}{k_2^*} = e^{-j90^\circ} \to U_3$$

$$III \to p_4 = p_3 = \frac{-1}{k_3^*} = e^{-j90^\circ} = e^{-j450^\circ} \to U_4$$

$$I, II \to p_5 = p_1 p_2 = \frac{-1}{k_1^* k_2^*} = e^{-j270^\circ} \to U_5$$

$$I, III \to p_6 = p_1 p_3 = \frac{-1}{k_1^* k_3^*} = e^{-j270^\circ} = e^{-j630^\circ} \to U_6$$

-continued $$\text{II, III} \rightarrow p_7 = p_2p_3 = \frac{1}{k_2^* k_3^*} = e^{-j180°} = e^{-j540°} \rightarrow U_7$$

$$\text{I, II, III} \rightarrow p_8 = p_1p_2p_3 = \frac{1}{k_1^* k_2^* k_3^*} = e^{-j360°} \rightarrow U_8$$

so that switching must be effective in such a way that the voltages are in chronological succession as follows:

$$U_m(t) = U_1 \xrightarrow{\tau} U_3 \xrightarrow{\tau} U_2 \xrightarrow{\tau} U_5 \xrightarrow{\tau} U_8 \xrightarrow{\tau} U_4 \xrightarrow{\tau} U_7 \xrightarrow{\tau} U_6 \quad (22)$$

Because of the equality of two weighting factors, the states and hence the rectangular signals of amplitudes $U_i$ are here distributed over two periods of the low-frequency signal; in this case, because of the special selection of the phase switching values, these signals are distributed at intervals of one-fourth period. Because the switching states are distributed over two periods, signals at the frequency $f = f_O/2$ arise, so that the bandpass filter must be designed so as to assure sufficiently high attenuation already at the frequencies $f = f_O/2$, $3f_O/2$.

Once again, the 180° switch can be replaced by an amplitude modulator in the high-frequency branch, and individual phase switches can be relocated in the reference branch.

Each device 5, 6 and 7 can be a conventional switchable phase shifter having a mechanical or electronic switch arranged to connect between the input and output of the phase shifter either a first allpass unit with a transmission phase $\phi_1$, or a second allpass unit with a transmission phase $\phi_2$. The transmission phase difference, $\Delta\phi = \phi_1 - \phi_2$, is the desired phase shift of the device, e.g., 180°, 90° or 45°. One example of a conventional allpass network is a transmission line of suitable length.

Frequency $f_1$ can typically have a value between 100 Hz and 1 MHz, although values outside this range may be used.

This application relates to subject matter disclosed in Federal Republic of Germany Application P P 38 21 040.1, filed on Jun. 23, 1988, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A homodyne network analyzer comprising an oscillator producing a single frequency signal, a measurement branch and a reference branch each connected to receive the single frequency signal and to produce a respective branch output signal, a multistage single-sideband shifter forming a part of one of said branches, a mixer connected to receive and combine the two branch output signals to produce a low frequency mixer output signal, and bandpass filter means connected to filter the mixer output signal in order to produce a sine wave signal containing the information relating to modifications experienced by the single frequency signal in the measurement branch in terms of magnitude and phase; wherein said multistage single-sideband shifter comprises N switchable phase shifters connected in cascade, where N is a positive integer greater than 1, each said phase shifter including switch means connected for switching the phase shift produced by each phase shifter, and control means connected to said switch means for switching said switch means chronologicaly successively in a selected sequence into all possible $2^N$ combinations, and for periodically repeating the selected sequence, the selected sequence having a special time sequential order of the phase shifts such that the time position of a certain phase shift value is given by a scheme as described by the following steps:
   a) for each possible combination of the positions of said switch means, calculating, in degrees, a characteristic quantity, which is called the "summed phase shift value", by adding all individual phase shift values in degrees, and adding or subtracting multiples of 360° to convert the summed phase shift value into the range from 0° to 360°;
   b) varying the summed phase shifts provided in step a) by plus or minus 180°, whenever the number of active phase switches is odd;
   c) based on the summed phase shifts obtained in steps a) and b), operating said switching means in combinations in an order such that the associated summed phase shifts decrease monotonously, wherein if any summed phase shift value appear as more than once, only a combination in accordance with this value is allowed to be put into the order, and the other summed phase shift values are modified by adding −360°, as often as necessary until no further ambiguity is present;
   d) activating the switching combinations non-overlappingly, in the sequence defined by step c) in chronological succession, each with the same duration, such that a selected uniform reference point is proportional to the associated modified summed phase shift values, and such that more-negative summed phase shift values lead to chronologically later activation times; and
   e) at the time at which none of the possible $2^N$ states is activated, blanking out the signal; and wherein one of said phase shifters is shiftable in phase by 180° and a plurality of said phase shifters is shiftable in phase by 90°.

2. An analyzer as defined in claim 1 wherein said multistage single-sideband shifter forms a part of each of said branches, with at least a respective one of said switchable phase shifters being connected in each said branch.

3. An analyzer as defined in claim 1, further comprising an on/off switch connected between said mixer and said bandpass filter, said switch being periodically switchable, at the transition times from one phase switching state to another, to perform a blanking operation, and being arranged to perform an arbitrary but always identical amplitude weighting between blanking operations.

4. A multistage single-sideband shifter comprising N switchable phase shifters connected in cascade, where N is a positive integer greater than 1, each said phase shifter including switch means connected for switching the phase shift produced by each phase shifter, and control means connected to said switch means for switching said switch means chronologically successively in a selected sequence into all possible $2^N$ combinations, and for periodically repeating the selected sequence.

5. A device as defined in claim 4 with a special time sequential order of the phase shifts such that the time position of a certain phase shift value is given by a scheme as described by the following steps:
  a) for each possible combination of the positions of said switch means, calculating, in degrees, a characteristic quantity, which is called the "summed phase shift value", by adding all individual phase shift values in degrees, and adding or subtracting multiples of 360° to convert the summed phase shift value into the range from 0° to 360°;
  b) varying the summed phase shifts provided in step a) by plus or minus 180°, whenever the number of active phase switches is odd;
  c) based on the summed phase shifts obtained in steps a) and b), operating said switching means in combinations in an order such that the associated summed phase shifts decrease monotonously, wherein if any summed phase shift value appears more than once, only a combination in accordance with this value is allowed to be put into the order, and the other summed phase shift values are modified by adding −360°, as often as necessary until no further ambiguity is present;
  d) activating the switching combinations non-overlappingly, in the sequence defined by step c) in chronological succession, each with the same duration, such that a selected uniform reference point is proportional to the associated modified summed phase shift values, and such that more-negative summed phase shift values lead to chronologically later activation times; and
  e) at the times at which none of the possible $2^N$ states is activated, blanking out the signal.

6. A device as defined in claim 5 wherein the summed phase provided in step a) is varied by a further plus or minus 180° whenever one of the activated phase switches is a 180° switch.

7. A device as defined in claim 5 wherein said phase shifters are switchable by amounts corresponding to the continuous division of 360° by 2 for permitting an uninterrupted occupation of the time axis.

8. A device as defined in claim 5 wherein one of said phase shifters is shiftable in phase by 180° and a plurality of said phase shifters is shiftable in phase by 90°.

9. A device as defined in claim 4 wherein said control means are further operative for chronologically reversing the selected sequence.

10. A method of operating a multistage single-sideband shifter comprising N switchable phase shifters connected in cascade, where N is a positive integer greater than 1, each phase shifter including switch means connected for switching the phase shift produced by each phase shifter, and control means connected to the switch means for controlling the switch means, comprising the steps of: switching the phase shifters chronologically successively in a selected sequence into all possible $2^N$ combinations; and periodically repeating the selected sequence.

11. A method as defined in claim 10 with a special time sequential order of the phase shifts such that the time position of a certain phase shift value is given by a scheme as described by the following steps:
  a) for each possible combination of the positions of said switch means, calculating, in degrees, a characteristic quantity, which is called the "summed phase shift value", by adding all individual phase shift values in degrees, and adding or subtracting multiples of 360° to convert the summed phase shift value into the range from 0° to 360°;
  b) varying the summed phase shifts provided in step a) by plus or minus 180°, whenever the number of active phase switches is odd;
  c) based on the summed phase shifts obtained in steps a) and b), operating the switching means in combinations in an order such that the associated summed phase shifts decrease monotonously, wherein if any summed phase shift value appears more than once, only a combination in accordance with this value is allowed to be put into the order, and the other summed phase shift values are modified by adding −360°, as often as necessary until no further ambiguity is present;
  d) activating the switching combinations non-overlappingly, in the sequence defined by step c) in chronological succession, each with the same duration, such that a selected uniform reference point is proportional to the associated modified summed phase shift values, and such that more-negative summed phase shift values lead to chronologically later activation times; and
  e) at the times at which none of the possible $2^N$ states is activated, blanking out the signal.

12. A method as defined in claim 10 further comprising chronologically reversing the selected sequence.

* * * * *